US010516563B2

(12) United States Patent
Sievert et al.

(10) Patent No.: US 10,516,563 B2
(45) Date of Patent: Dec. 24, 2019

(54) APPARATUS AND A METHOD FOR GENERATING A RADIO FREQUENCY SIGNAL

(71) Applicant: Intel IP Corporation, Santa Clara, CA (US)

(72) Inventors: Sebastian Sievert, Munich (DE); Ofir Degani, Nes-Ammin (IL); Ashoke Ravi, Portland, OR (US); Rotem Banin, Even-Yehuda (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/753,551

(22) PCT Filed: Sep. 25, 2015

(86) PCT No.: PCT/IB2015/057375
§ 371 (c)(1),
(2) Date: Feb. 20, 2018

(87) PCT Pub. No.: WO2017/051216
PCT Pub. Date: Mar. 30, 2017

(65) Prior Publication Data
US 2018/0262383 A1    Sep. 13, 2018

(51) Int. Cl.
*H04L 27/36* (2006.01)
*H03C 3/40* (2006.01)
*H03M 1/66* (2006.01)

(52) U.S. Cl.
CPC ............ *H04L 27/362* (2013.01); *H03C 3/40* (2013.01); *H03M 1/66* (2013.01); *H03C 2200/0058* (2013.01)

(58) Field of Classification Search
CPC ...................................................... H04L 27/362
(Continued)

(56) References Cited

U.S. PATENT DOCUMENTS

2004/0125901 A1 * 7/2004 Nakahara ............... H04L 7/041
375/368
2005/0238114 A1   10/2005 Ishikawa et al.
(Continued)

FOREIGN PATENT DOCUMENTS

EP    0283725 A2    9/1988
EP    0631398 A2    12/1994

*Primary Examiner* — Lihong Yu
(74) *Attorney, Agent, or Firm* — 2SPL Patent Attorneys PartG mbB; Kieran O'Leary (57) ABSTRACT

An apparatus for generating a radio frequency signal based on a symbol within a constellation diagram is provided. The constellation diagram is spanned by a first axis representing an in-phase component and an orthogonal second axis representing a quadrature component. The apparatus includes a processing unit configured to select a segment of a plurality of segments of the constellation diagram containing the symbol. The segment is delimited by a third axis and a fourth axis each crossing the origin of the constellation diagram and spanning an opening angle of the segment of less than about 90°. The processing unit is further configured to calculate a first coordinate of the symbol with respect to the third axis, and a second coordinate of the symbol with respect to the fourth axis. The apparatus further includes a plurality of digital-to-analog converter cells configured to generate the radio frequency signal using the first coordinate and the second coordinate.

15 Claims, 6 Drawing Sheets

(58) Field of Classification Search
USPC .......................................................... 375/298
See application file for complete search history.

(56) References Cited

U.S. PATENT DOCUMENTS

2014/0348217 A1* 11/2014 Hsieh ............. H03K 19/017509
375/219
2015/0049840 A1 2/2015 Banin et al.

* cited by examiner

APPARATUS AND A METHOD FOR GENERATING A RADIO FREQUENCY SIGNAL

FIELD

Examples relate to wireless transmitter technology. In particular, examples relate to an apparatus and a method for generating a radio frequency signal based on a symbol in a constellation diagram.

BACKGROUND

Modern wireless transmitters (e.g. for cellular communication, Bluetooth or Wi-Fi) are dominated by two architectures: Cartesian (I/Q) transmitters and polar transmitters.

A digital Cartesian transmitter uses a Radio Frequency Digital-to-Analog Converter (RF-DAC) to generate a modulated radio frequency (RF) signal directly from a complex valued symbol having an in-phase component and a quadrature component. Two Local Oscillator (LO) signals of a same frequency, shifted by 90°, are used to clock the RF-DAC. The LO signals represent the in-phase and quadrature axes (vectors) of the constellation diagram. Cartesian architecture may handle modulation schemes with high bandwidth, but suffers from 3 dB efficiency loss for the worst case symbol (i.e. in-phase and quadrature magnitude of the symbol are equal).

A digital polar transmitter may be attractive for modern radios due to improved area and power consumption compared to conventional analog architectures. In polar architecture, a symbol is expressed by phase and amplitude information. A Digital-to-Time Converter (DTC) may be used to apply phase modulation and/or frequency shifts on a constant LO signal. The modulated output of the DTC may be used to clock a RF-DAC. The RF-DAC may apply amplitude modulation and adjust an output power of the RF signal. One advantage of polar architecture may be a high efficiency of the output stage and that only a single Phase-Locked-Loop (PLL) may provide the LO signal for multiple transmitters. Hence, a number of on-chip inductors may be reduced significantly. However, handling RF signals with a wide bandwidth is problematic with polar architecture.

Hence, there may be a desire for an improved transmitter architecture.

BRIEF DESCRIPTION OF THE FIGURES

Some examples of apparatuses and/or methods will be described in the following by way of example only, and with reference to the accompanying figures, in which

FIG. 3b illustrates an example of the Multi-Modulus Divider (MMD) illustrated in FIG. 3a;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent"), to name just a few examples.

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EUTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Figure 1:
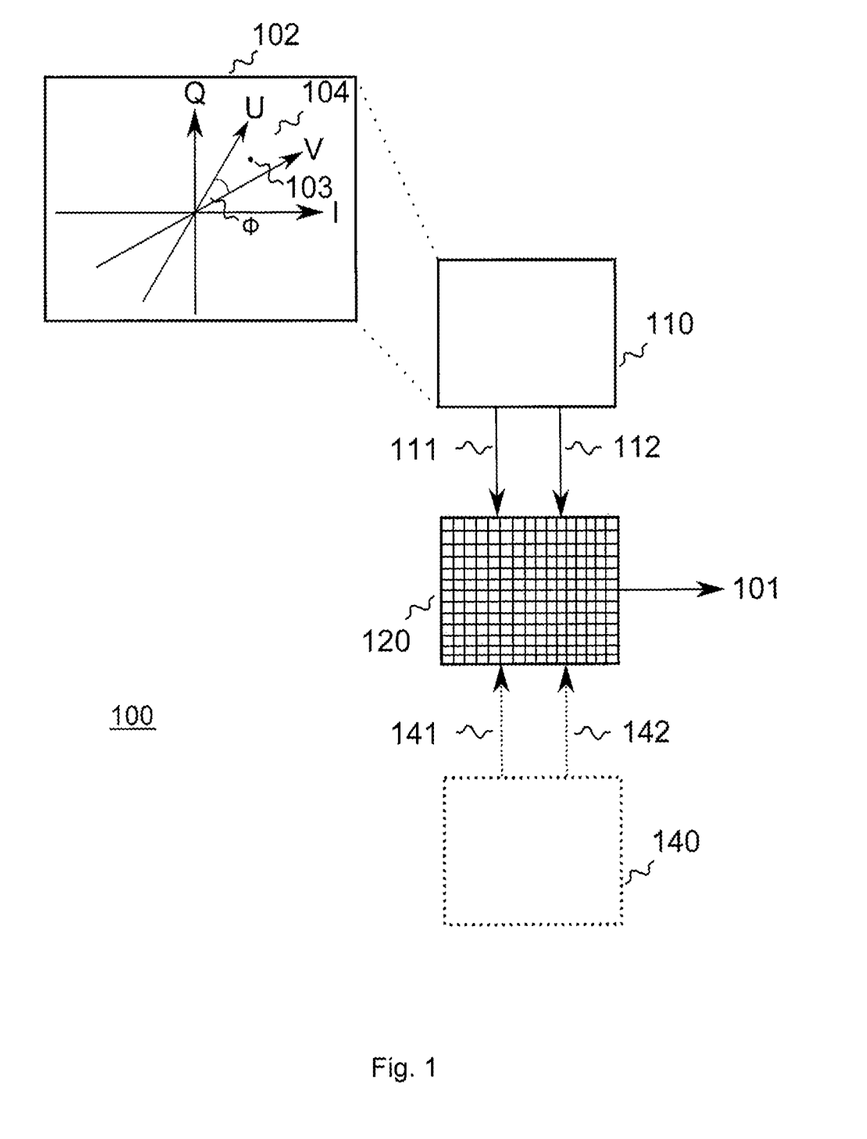
FIG. 1 illustrates an example of an apparatus for generating a RF signal based on a symbol within a constellation diagram.

FIG. 1 illustrates an apparatus 100 for generating a RF signal 101 based on a symbol 103 within a constellation diagram 102. The constellation diagram 102 is spanned by a first axis I representing an in-phase component and an orthogonal second axis Q representing a quadrature component, i.e., the first and second axes I, Q may be regarded as real and imaginary axes of a complex plane for the (complex valued) symbol 103. The symbol 103 is related to a baseband signal. For example, the symbol 103 represents a (complex valued) sample of the baseband signal.

The apparatus 100 comprises a processing unit 110 for selecting one segment 104 of a plurality of segments of the constellation diagram 102 that contains the symbol 103. In some examples, the constellation diagram 102 may contain an integer number of similar segments, i.e., each segment may be delimited by two radially extending boundaries crossing an origin of the constellation diagram 102 (i.e. crossing the intersect point of the first and second axes I, Q) and spanning a same opening angle of the segment. In some examples, the constellation diagram 102 may contain an integer number of segments having different opening angles. The opening angles of the plurality of segments are less than 90°. That is, the segments have opening angles smaller than the 90° opening angle of the four segments of the Cartesian I-Q plane.

The one segment 104 is delimited by a third axis V and a fourth axis U. Both the third axis V and the fourth axis U cross the origin of the constellation diagram 102 and span an opening angle $\Phi$ of the segment 104 of less than (about) 90°. For example, 360° may be a multiple integer of the opening angle $\Phi$. In some examples, the opening angle $\Phi$ may be equal to (about) 45°, 30°, 22.5°, 18°, 15°, 11.25°, 10°, 9°, 6°, 5°, 4.5°, 3°, 2°, 1° or 0.5°. The third and fourth axes V, U may be different from the first and second axes I, Q, i.e., none of the third and fourth axes V, U may in some examples coincide with the first and second axes I, Q. In some examples, one of the third and fourth axes V, U may be equal to one of the first and second axes I, Q, i.e., one of the third and fourth axes V, U may coincide with one of the first and second axes I, Q.

The processing unit 110 calculates a first coordinate 111 of the symbol 103 with respect to the third axis V, and a second coordinate 112 of the symbol 103 with respect to the fourth axis U. In other words, the processing unit transforms the coordinates of the symbol 103 with respect to the first and second axes I, Q to coordinates with respect to the third and fourth axes V, U.

The first coordinate 111 and the second coordinate 112 are provided to a plurality of digital-to-analog converter cells 120. In some examples, the plurality of digital-to-analog converter cells 120 are comprised by a single digital-to-analog converter (DAC) (e.g. a RF-DAC). In some examples, the plurality of digital-to-analog converter cells 120 may be comprised by two or more DACs (e.g. by two RF-DACs). The plurality of digital-to-analog converter cells 120 generate the (analog) RF signal 101 using at least (a signal or information related to) the first coordinate 111 and the second coordinate 112. For example, a current characteristic, a voltage characteristic, a power characteristic, or a time characteristic of the RF signal 101 may be analog.

The apparatus 100 may allow higher signal bandwidths for the RF signal 101 compared to polar transmitter architecture. Moreover, out-of-band noise may be reduced compared to polar architecture, i.e., a noise level outside a desired frequency range (frequency band) may be reduced compared to pure polar architecture. Moreover, executing a CORDIC (COordinate Rotation DIgital Computer) algorithm—as used in polar transmitter architecture for transforming in-phase and quadrature coordinates to amplitude and phase coordinates—may be avoided, so that a computation complexity of the symbols in the apparatus 100 may be reduced compared to polar transmitter architecture. Compared to Cartesian transmitter architecture, an efficiency (power) loss of the transmitter 100 may be reduced since LO signals having a phase shift smaller than 90° may be used for the plurality of digital-to-analog converter cells 120. Furthermore, the increased efficiency compared to Cartesian transmitter architecture may allow to reduce the number of digital-to-analog converter cells compared to a Cartesian transmitter architecture. Accordingly, a complexity and a current consumption of the apparatus 100 may be reduced compared to Cartesian transmitter architecture. Hence, the apparatus 100 may avoid drawbacks of conventional polar transmitter architecture and conventional Cartesian transmitter architecture.

In some examples, the plurality of digital-to-analog converter cells 120 further generates the RF signal 101 based on a first LO signal 141 and a second LO signal 142. The first and second LO signals comprise a phase difference equal to the opening angle $\Phi$ of the one segment 104. For example, the plurality of digital-to-analog converter cells 120 generates a first RF component using the first coordinate 111 and the first LO signal 141, and a second RF component using the second coordinate 111 and the second LO signal 142. In some examples, a first part of the plurality of digital-to-analog converter cells 120 may generate the first RF component, and a second part of the plurality of digital-to-analog converter cells 120 may generate the second RF component. For example, the number of digital-to-analog converter cells (e.g. the number of active cells of the first part) for generating the first RF component may be related (e.g. proportional) to the first coordinate, and the number of digital-to-analog converter cells (e.g. the number of active cells of the second part) for generating the second RF component may be related (e.g. proportional) to the second coordinate.

Using LO signals 141, 142 having a phase difference of less than 90° may allow to increase the efficiency of the apparatus 100 compared to conventional Cartesian transmitter architecture. For Cartesian transmitter architecture, the power loss may be determined according to $$P_{loss} = 20 \cdot \log\left(\cos\left(\frac{\Phi}{2}\right)\right), \quad (1)$$

with $\Phi$ denoting the phase difference between the LO signals (i.e. the opening angle of the one segment, which is 90° for Cartesian transmitter architecture). For example, an efficiency loss of 3 Decibel (dB) for conventional Cartesian transmitter architecture may be reduced to 0.7 dB for an opening angle $\Phi=45°$, or to 0.2 dB for an opening angle $\Phi=22.5°$. The apparatus 100 may further comprise a signal combiner (not illustrated) for combining the first radio frequency component and the second radio frequency component to the RF signal 101.

Generally speaking, some examples relate to a means for generating a radio frequency signal based on a symbol within a constellation diagram spanned by a first axis representing an in-phase component and an orthogonal second axis representing a quadrature component. The means comprises a means for selecting a segment of a plurality of segments of the constellation diagram containing the symbol. The segment is delimited by a third axis and a fourth axis each crossing the origin of the constellation diagram and spanning an opening angle of the one segment of less than (about) 90°. The means for selecting is further configured to calculate a first coordinate of the symbol with respect to the third axis, and a second coordinate of the symbol with respect to the fourth axis. The means further comprises a means for generating the radio frequency signal using the first coordinate and the second coordinate.

The means for generating a radio frequency signal may be implemented by an apparatus for generating a radio frequency signal described above or below (e.g. FIG. 1). The means for selecting may be implemented by a processing unit described above or below (e.g. FIG. 1). The means for generating the radio frequency signal using the first coordinate and the second coordinate may be implemented by a plurality of digital-to-analog converter cells described above or below (e.g. FIG. 1).

Figure 2A:
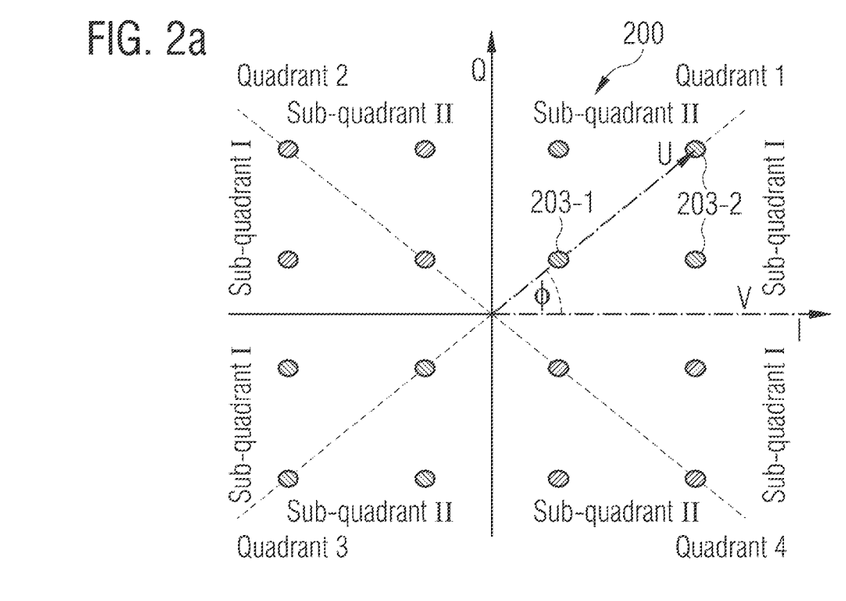
FIG. 2a illustrates an example of a constellation diagram.

FIG. 2a illustrates a constellation diagram 200 spanned by a first axis I and an orthogonal second axis Q. The complex plane of the constellation diagram 200 is divided into four quadrants defined by the first and second axes I,Q, and each quadrant is divided into two sub-quadrants, i.e., the complex plane of the constellation diagram 200 is divided into eight segments each having an opening angle $\Phi=45°$.

For transmitting one of the symbols 203-1, 203-2 or 203-3 sub-quadrant I of quadrant 1 is selected since the sub-quadrant I contains the symbol 203-1, 203-2, 203-3. A first coordinate of the symbol 203-1, 203-2, 203-3 with respect to a third axis V delimiting the subquadrant I, and a second coordinate of the symbol 203-1, 203-2, 203-3 with respect to a fourth axis U delimiting the sub-quadrant I is calculated. In other words, the I-Q coordinates of the symbol 203-1, 203-2, 203-3 is transformed (converted) to V-U coordinates. For example, for $\Phi=45°$, a simple matrix multiplication may be used for calculating the third and fourth coordinates in the sub-quadrant I:

$$\begin{bmatrix} U \\ V \end{bmatrix} = \begin{bmatrix} 0 & \frac{1}{\sin 45°} \\ 1 & -1 \end{bmatrix} \begin{bmatrix} I \\ Q \end{bmatrix} = \begin{bmatrix} 0 & \sqrt{2} \\ 1 & -1 \end{bmatrix} \begin{bmatrix} I \\ Q \end{bmatrix} \quad (2)$$

Accordingly, a matrix multiplication may be used for calculating third and fourth coordinates, if sub-quadrant II contains the symbol (e.g. symbol 203-1 or symbol 203-2):

$$\begin{bmatrix} U \\ V \end{bmatrix} = \begin{bmatrix} \frac{1}{\sin 45°} & 0 \\ -1 & 1 \end{bmatrix} \begin{bmatrix} I \\ Q \end{bmatrix} = \begin{bmatrix} \sqrt{2} & 0 \\ -1 & 1 \end{bmatrix} \begin{bmatrix} I \\ Q \end{bmatrix} \quad (3)$$

Figure 2B:
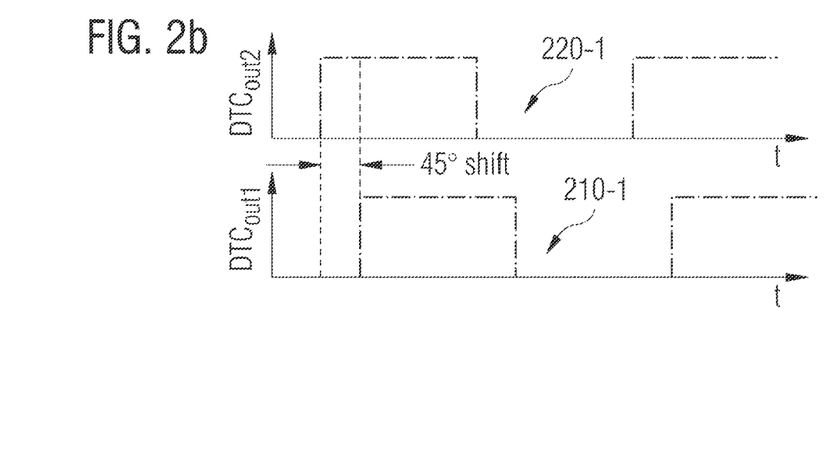
FIG. 2b illustrates an example of a relation between two LO signals.

For generating a corresponding RF signal, a first LO signal 210-1 for the third coordinate and a second LO signal 220-1 for the fourth coordinate as illustrated in FIG. 2b may be used (e.g. by a plurality of digital-to-analog converter cells). The first and second LO signals 210-1, 220-1 may, e.g., be provided by a DTC based on a reference LO signal and information on the selected segment (i.e. sub-quadrant). The first and second LO signals 210-1, 220-2 comprise a phase shift of 45°, i.e., the phase shift is equal to the opening angle Φ of the sub-quadrant I (i.e. of the selected segment). The second LO signal 220-1 leads the first LO signal 210-1 in the time domain.

Figure 2C:
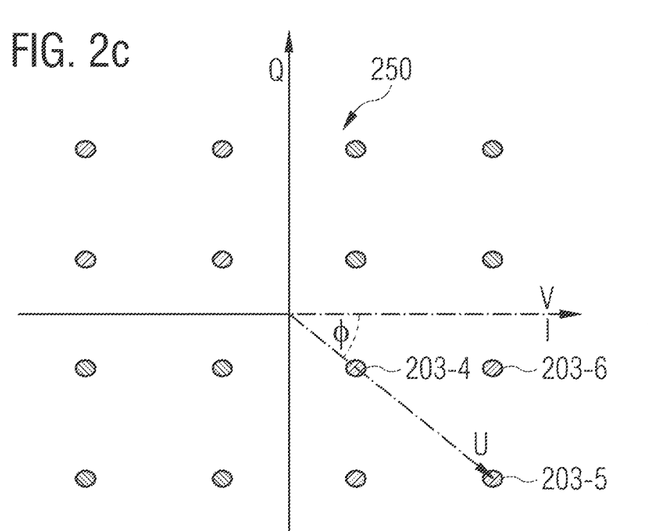
FIG. 2c illustrates another example of a constellation diagram.
Figure 2D:
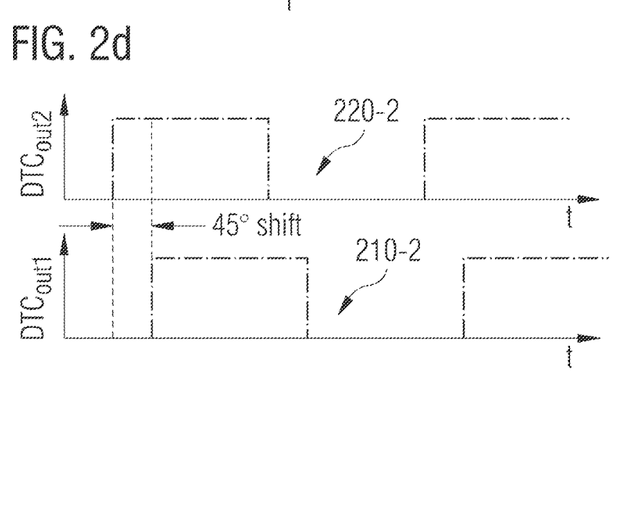
FIG. 2d illustrates another example of a relation between two LO signals.

FIG. 2c illustrates another constellation diagram 250 spanned by the orthogonal first and second axes I, Q. In the situation illustrated in FIG. 2c, one of the symbols 203-4, 203-5 or 203-6 is to be transmitted. Accordingly, a segment of the complex plane delimited by third and fourth axes V, U is selected which contains (encloses) the symbol 203-4, 203-5, 203-6. The third and fourth axes V, U span again an opening angle Φ=45°. Compared to FIG. 2a, the third axis is identical for both situations, whereas the fourth axis is rotated by 90°. Accordingly, the second LO signal 220-2 trails the first LO signal 210-2 in the time domain as illustrated in FIG. 2d, whereas the absolute value of the phase difference between the first and second LO signals 210-2, 220-2 is again equal to the opening angle Φ of the selected segment.

In other words, for the example of a 45° phase shift, the coordinates of the symbol with respect to the third and fourth axes may be determined as follows: 1) Determine the I/Q domain quadrant, in which the symbol lies. For example, this may be done by checking the sign of it's I and Q component. 2) Check if the I component is larger or smaller than the Q component and select sub-quadrant I if I≥Q, or select sub-quadrant II if I<Q. FIG. 2 a) illustrates an examples of the quadrant and sub-quadrant positions. 3) The I/Q symbol may be converted to the U/V domain in dependence of the sub-quadrant using formulas (2) and (3). Smaller phase shifts may lead to a higher number of sub-quadrants, increasing the complexity of this calculation, but leading also to higher power efficiency of the plurality of digital-to-analog converter cells (of, e.g., a current mode RF-DAC, IDAC, or a capacitive RF-DAC, CDAC). Compared to polar transmitter architecture, the U/V parts and the polar component may be extracted without a CORDIC algorithm, which is generally employed in a polar transmitter for calculating phase and amplitude of the incoming I/Q symbols.

Figure 3A:
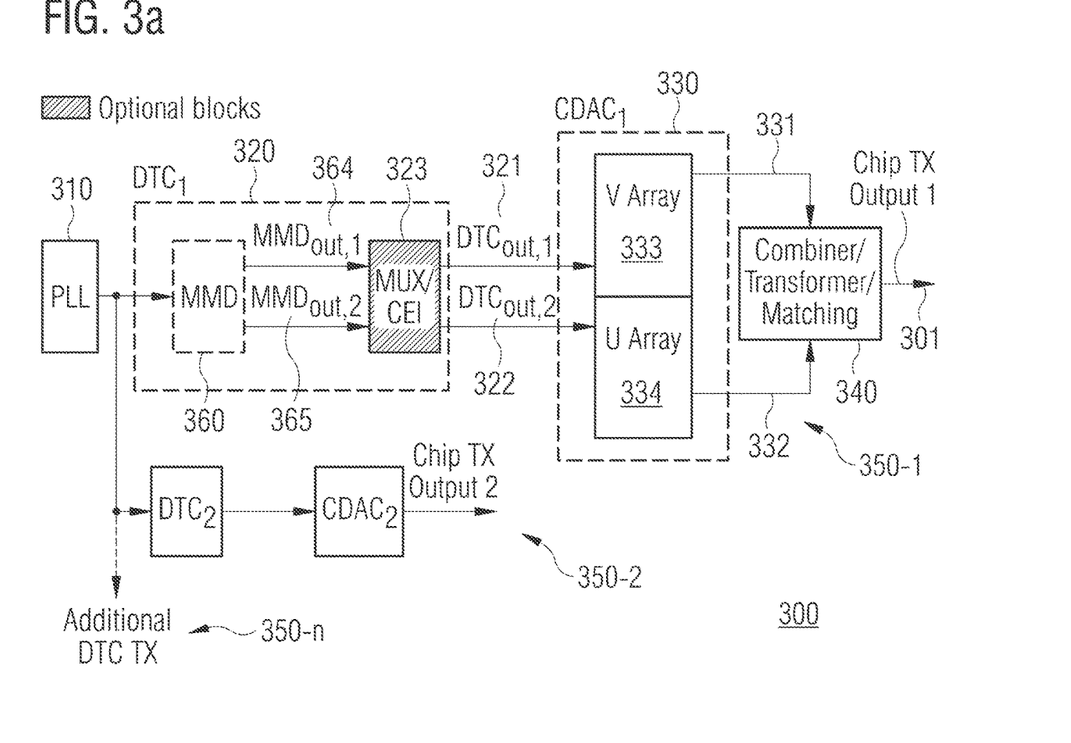
FIG. 3a illustrates another example of an apparatus for generating a RF signal based on a symbol within a constellation diagram.

FIG. 3a illustrates another example of an apparatus 300 for generating a RF signal 301 based on a symbol within a constellation diagram. A PLL 310 provides a reference LO signal (e.g. a differential output signal of a Voltage Controlled Oscillator, VCO, of the PLL) to a DTC 320. The DTC 320 generates a first LO signal (DTC$_{out,1}$) 321 and a phase shifted second LO Signal (DTC$_{out,2}$) 322 of the same frequency. For example, for the constellation diagrams illustrated in FIGS. 2a and 2b, the first LO signal 321 and the second LO signal 322 may have a phase shift of 45° as illustrated in FIGS. 2b and 2d.

The first and second LO signal 321, 322 are provided to a DAC 330 comprising a plurality of digital-to-analog converter cells (e.g. a capacitive DAC, CDAC). As indicated in FIG. 3a, a first part (array) 333 of the plurality of digital-to-analog converter cells may be supplied with the first coordinate and the first LO signal 321 in order to generate a first RF component 331, whereas a second part (array) 334 of the plurality of digital-to-analog converter cells may be supplied with the second coordinate and the second LO signal 322 in order to generate a second RF component 332. A combiner 340 combines the first RF component 331 and the second RF component 332 in order to provide the RF signal 301, wherein subsequent to the combiner 340 further elements like an impedance matching may be provided. In alternative embodiments, the combiner may be effectively provided by short-circuiting the first part (array) 333 of the plurality of digital-to-analog converter cells and the second part (array) 334 of the plurality of digital-to-analog converter cells to generate the RF signal.

As indicated in FIG. 3a, multiple transmit paths 350-1, 350-2, . . . , 350-n may be operated using a single PLL for providing the reference LO signal.

In other words, FIG. 3a may illustrate an example of the proposed architecture, wherein differential signals are shown as single ended. A PLL may generate a differential VCO signal, which may be used by the DTC to generate two differential output clocks with the same frequency, shifted by a phase Φ against each other. For example, Φ=45° may lead to DTC output waveforms as illustrated in FIGS. 2b and 2d. The phase shift is smaller than the 90° phase shift of conventional I/Q transmitters. The DTC output signals may clock two array parts of an RF-DAC, so that new vectors U/V in the I/Q domain may be spanned as, e.g., illustrated in FIGS. 2a and 2c. For a given I/Q symbol the DTC may be configured such, that the vectors U and V enclose the transmit symbol in the constellation diagram. The I/Q symbols may be converted to the U/V domain and can be used as digital data inputs for the U and V array parts. Aligned with the clocking this may result in a modulated output signal at the RF-DAC (e.g. a CDAC, an IDAC or a Digital Power Amplifier, DPA) output. With the proposed architecture it may be possible, but not necessary, to operate multiple transmitters with a single PLL.

The DTC 320 illustrated in FIG. 3a comprises a MMD 360. The MMD 360 generates based on a pair of differential reference LO signals 311, 312 (provided by the PLL 310) and a nominal division rate N$_{nom}$, a pair of differential LO signals 364, 365. The frequency of the pair of differential LO signals 364, 365 comprises a frequency equal to $$f_{MMD,out} = \frac{f_{VCO}}{N_{nom}}, \quad (4)$$

with f$_{VCO}$ denoting the frequency of the pair of differential reference LO signals 311, 312.

In some examples, multi-stage architectures may be used to decrease a phase shift between the pair of differential LO signals 364, 365. For example, a Multiplexer (MUX)/Controlled Edge Interpolator (CEI) 323 may be provided to decrease the phase shift between the pair of differential LO signals 364, 365.

Figure 3B:
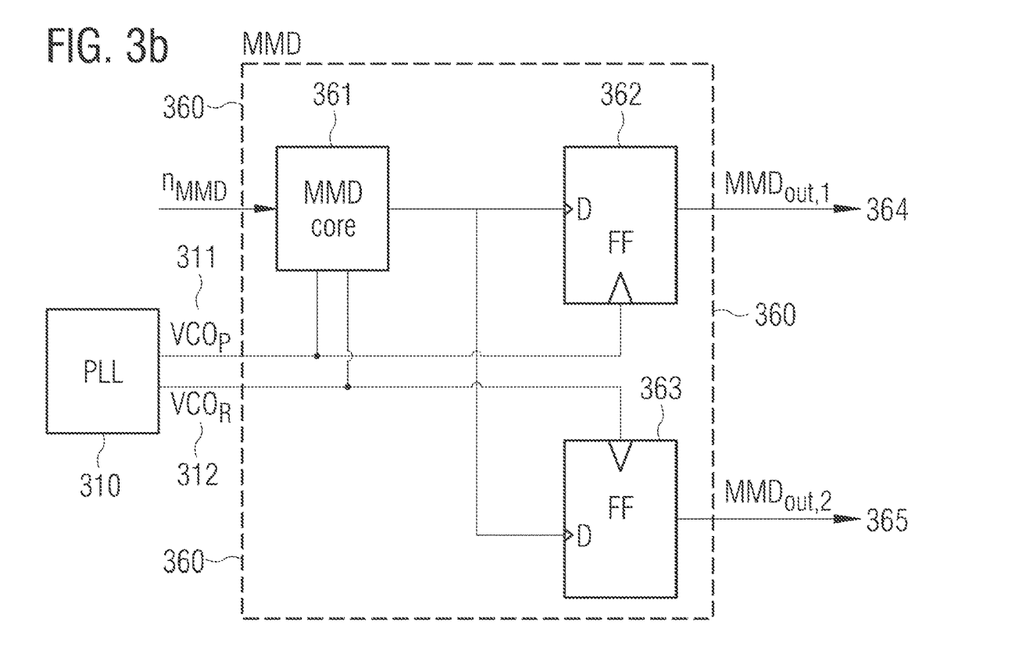

The pair of differential LO signals 364, 365 (optionally with reduced phase difference) is provided as the first and second LO signals 321, 322. Details of the MMD 360 are illustrated in FIG. 3b.

The MMD 360 comprises a MMD core 361 for dividing the frequency of the pair of differential reference LO signals 311, 312 based on a digital input code word n$_{MMD}$ related to the nominal division rate N$_{nom}$. Flip flops 362, 363 (e.g. low noise flip flops) are provided for re-sampling the output of the MMD core 361 in order to provide the pair of differential LO signals 364, 365. The two differential LO signals 364, 365 are shifted by a half oscillation period of the differential reference LO signals 311, 312:

$$\Delta t = \frac{T_{VCO}}{2} = \frac{1}{2 \cdot f_{VCO}}, \quad (5)$$

with $T_{VCO}$ denoting the length of the oscillation period of the differential reference LO signals 311, 312, and $f_{VCO}$ denoting the frequency of the pair of differential reference LO signals 311, 312.

That is, $MMD_{out,1}$ may move on the grid of $T_{VCO}$, and $MMD_{out,2}$ may lead or trail $MMD_{out,1}$ by the time difference $$\Delta t = \frac{T_{VCO}}{2}.$$

By inserting equation (4) in equation (5), the relation between the time difference and the frequency of the pair of differential LO signals 364, 365 can be calculated as $$\Delta t = \frac{1}{2 \cdot N_{nom} \cdot f_{MMD,out}}. \quad (6)$$

That is, both differential LO signals 364, 365 depend on the nominal division rate $N_{nom}$, i.e., on the digital input code word $n_{MMD}$. The time difference between the differential LO signals 364, 365 of equation (6) may be expressed in the phase domain as $$\Phi = 360° \cdot \frac{\Delta t}{T_{MMD,out}} = \frac{360°}{2 \cdot N_{nom}}. \quad (7)$$

For example, for a high bandwidth RF signal, $N_{nom}=4$ may be selected, so that the pair of differential LO signals 364, 365 output by the MMD are phase shifted by $\Phi=45°$. For a low bandwidth RF signal, the nominal division ratio $N_{nom}$ may, e.g., be two to four times higher, so that the phase difference between the pair of differential LO signals 364, 365 is even smaller.

That is, the DTC 320 may be understood as multi-phase generator that generates the first LO signal 321 using a first signal component 311 of a reference LO signal (provided by the PLL 310) and information on the one selected segment (e.g. by the digital input code word $n_{MMD}$ holding information on the number of the segments and thus the opening angle of the selected segment), and generates the second LO signal 322 using a second signal component 311 of the reference LO signal (provided by the PLL 310) and the information on the one segment (e.g. the digital input code word $n_{MMD}$).

In other words, depending on the nominal division ratio of the MMD, which can be different for Low Band (LB) and High Band (HB) transmission, the phase shift between the output signals may be smaller than 45° or 22.5°. The time difference $\Delta t$ of the MMD outputs may be constant and based on the period of the VCO of the PLL, whereas the output phase shift may further depend on the transmit frequency. The MMD may operate around the nominal division by $N_{nom}$ leading to an output frequency according to equation (4). The MMD core may generate a divided VCO signal based on the digital input code word $n_{MMD}$. The output of the core may be re-sampled by low noise flip flops on the p- and n-part of the differential VCO signal—$VCO_p$ and $VCO_n$. This may lead to two output signals shifted by half the VCO period according to equation (5).

That is, $MMD_{out,1}$ may move on the grid of $T_{VCO}$, whereas $MMD_{out,2}$ may lead or lag $MMD_{out,1}$ by $$\frac{T_{VCO}}{2},$$

both depending on the digital programming code word $n_{MMD}$. Solving (4) for $f_{VCO}$ and inserting it in (5) may lead to the direct relation of $\Delta t$ and the MMD output frequency according to equation (6), which can be expressed in the phase domain according to equation (7). A use case for HB may be $N_{nom}=4$, leading to $\Phi=45°$ at the MMD output. LB operation may use two to four times of this nominal division ratio, leading to an even smaller phase difference.

The coarse stage implementation may not be limited to the implementation as a MMD. In general, any multi-phase generator like, e.g., a Delay Locked Loop (DLL) may be used. In addition, a multi-stage implementation (e.g. employing a MUX/CEI as second stage as illustrated in FIG. 3a) may be used to reduce the phase shift $\Phi$ by a factor of 2 (e.g. $\Phi=45°$ to $\Phi=22.5°$). If left out, the DTC outputs are equal to the MMD outputs.

For I/Q transmitters, the maximum power loss is depending on the phase shift of the clock signals of the CDAC arrays according to equation (1). The 90° phase shift of conventional I/Q transmitters leads to 3 dB loss. Reducing the spacing with the proposed architecture may lead to 0.7 dB maximum loss for $\Phi=45°$ and 0.2 dB loss for $\Phi=22.5°$, i.e., increase the power efficiency of a transmitter towards the efficiency of polar transmitters showing the best power efficiency today. By reducing the maximum required output power due to increased efficiency, also the overall size of the CDAC arrays may be reduced.

Figure 4A:
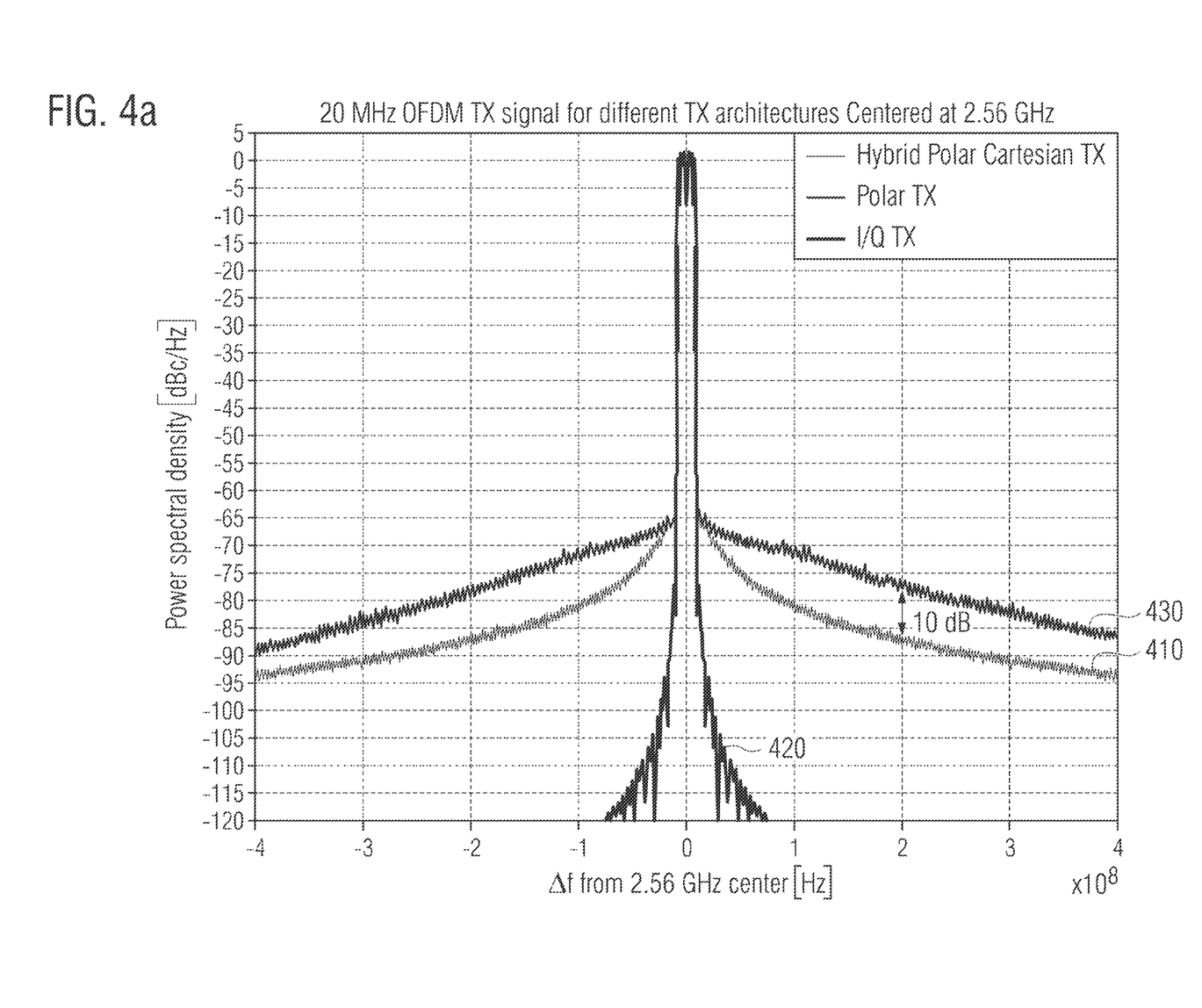
FIG. 4a illustrates an example of spectra for a RF signal generated according to an example described herein, a RF signal generated using a Cartesian transmitter, and a RF signal generated using a polar transmitter.

A comparison of the proposed architecture compared to conventional Cartesian and polar transmitter architectures is illustrated in FIG. 4a. FIG. 4a illustrates spectra for a RF signal 410 generated according to an example described herein, a RF signal 420 generated using a conventional Cartesian transmitter, and a RF signal 430 generated using a conventional polar transmitter. The RF signals 410, 420, 430 represent Orthogonal Frequency Division Multiplexing (OFDM) signals with 20 MHz bandwidth and a center frequency of 2.56 GHz. For the situation illustrated in FIG. 4a, ideal rectangular LO signals for clocking the plurality of digital-to-analog converter cells are assumed.

At a distance of 200 MHz from the center frequency, the RF signal 410 for the proposed architecture has a 10 dB reduced signal strength compared to the RF signal 430 for the polar transmitter. That is, an out-of-band noise level of the proposed architecture may be reduced compared to the conventional polar transmitter architecture.

Figure 4B:
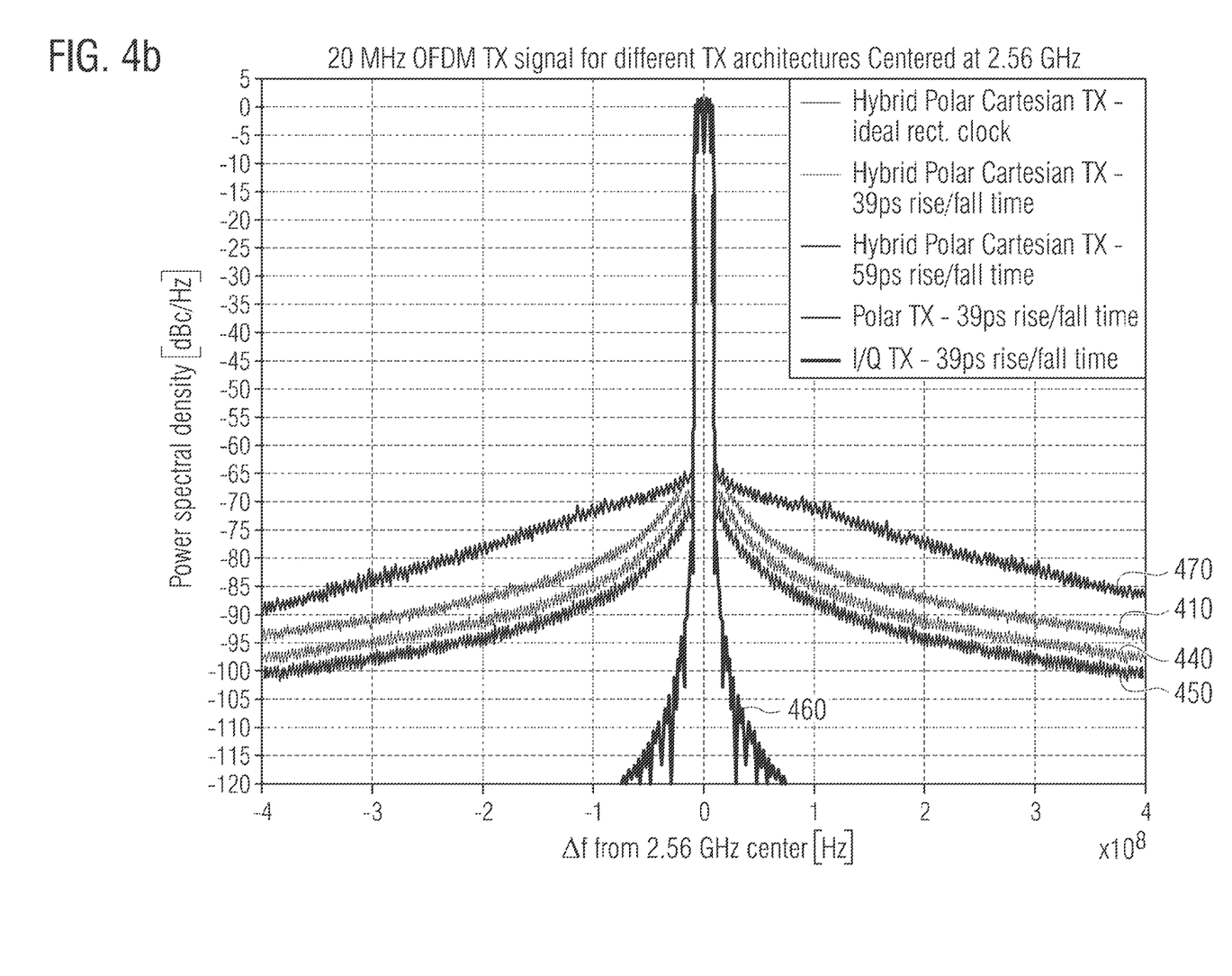
FIG. 4b illustrates another example of spectra for RF signals generated according to an example described herein, a RF signal generated using a Cartesian transmitter, and a RF signal generated using a polar transmitter.

FIG. 4b illustrates further spectra for realistic rise/fall times (slopes) of the LO signals. The edges of the LO signals are modelled as half-sine shaped edges. The rise times relate to a rise from 10% to 90% of the half-sine edge. In addition to the above RF signal 410, a RF signal 440 generated according to an example described herein for a rise time of 39 ps, and a RF signal 450 generated according to an example described herein for a rise time of 59 ps are illustrated. Further, a RF signal 460 generated using a Cartesian transmitter for a rise time of 39 ps, and a RF signal 470 generated using polar transmitter architecture for a rise time of 39 ps are illustrated.

In FIG. 4b, the signal strengths of the RF signals 440, 450 are reduced by 5 dB and 8 dB close to the transmission band and by 14 dB and 17 dB at 200 MHz offset to the center frequency. That is, also for realistic rise times of the LO signals, an out-of-band noise level of the proposed architecture may be reduced compared to the conventional polar transmitter architecture.

In other words, the bandwidth of the proposed architecture may be better than a pure polar approach, but worse than pure I/Q. For FIGS. 5a, 5b, an OFDM signal is illustrated with 20 MHz bandwidth, centered at 2.56 GHz. FIG. 5a illustrates the output spectrum for ideal rectangular signals for CDAC clocking, and FIG. 5b for the case of signals with realistic slopes (modelled as half-sine shaped edges). FIG. 5a illustrates up to 10 dB improvement in out-of-band noise at 200 MHz offset, but close to the band it is on the same level as Polar TX. FIG. 5b illustrates realistic slopes of 39 ps (59 ps) for 10%-90% of the half sine edge. Here the floor drops by 5 dB (8 dB) close to the band and at 200 MHz offset by 14 dB (17 dB). The polar and I/Q signals show no difference for the variation in signal slope.

The proposed architecture may thus be understood as a trade-off between polar and I/Q transmitters: 1) The bandwidth may better than for pure polar transmitters, but worse than for pure I/Q transmitters. 2) The power efficiency may be better than for pure I/Q transmitters, but worse than for pure polar transmitters.

Figure 5:
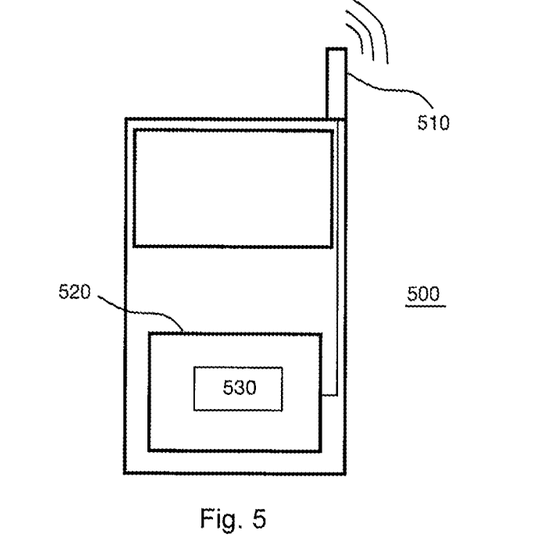
FIG. 5 illustrates an example of a mobile communications device comprising an apparatus for generating a RF signal based on a symbol within a constellation diagram.

An example of an implementation using RF signal generation according to one or more aspects of the proposed concept or one or more examples described above is illustrated in FIG. 5. FIG. 5 schematically illustrates an example of a mobile communications device or mobile phone or user equipment 500 comprising an apparatus 530 for generating a RF signal based on a symbol within a constellation diagram (e.g. related to a baseband signal) according to an example described herein. The apparatus 530 may be comprised in a transmitter 520. An antenna element 510 of the mobile communications device 500 may be coupled to the transmitter 520. To this end, mobile communications devices may be provided with improved signal transmission characteristics (e.g. offering high signal bandwidth and high efficiency).

Figure 6:
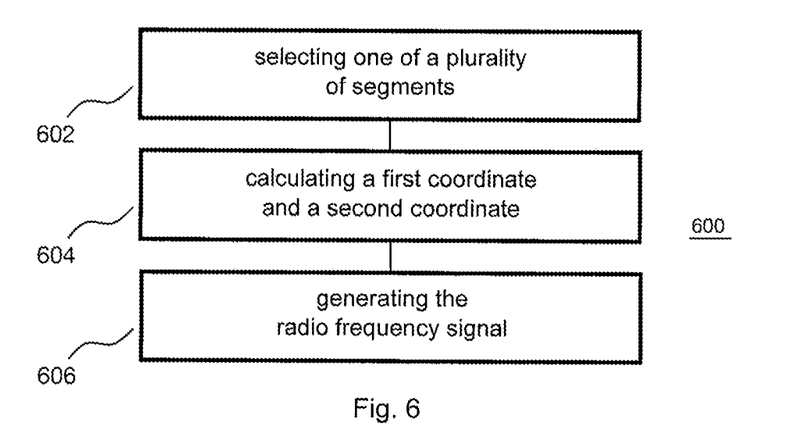
FIG. 6 illustrates a flowchart of an example of a method for generating a RF signal based on a symbol within a constellation diagram.

An example of a method 600 for generating a RF signal based on a symbol within a constellation diagram is illustrated by means of a flowchart in FIG. 6. The constellation diagram is spanned by a first axis representing an in-phase component and an orthogonal second axis representing a quadrature component. The method comprises selecting 602 a segment of a plurality of segments of the constellation diagram containing the symbol. The segment is delimited by a third axis and a fourth axis each crossing the origin of the constellation diagram and spanning an opening angle of the one segment of less than about 90°. Further, the method comprises calculating 604 a first coordinate of the symbol with respect to the third axis, and a second coordinate of the symbol with respect to the fourth axis. The method further comprises generating 606 the radio frequency signal using the first coordinate and the second coordinate.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

The examples as described herein may be summarized as follows:

Example 1 is an apparatus for generating a radio frequency signal based on a symbol within a constellation diagram spanned by a first axis representing an in-phase component and an orthogonal second axis representing a quadrature component, the apparatus comprising: a processing unit configured to select a segment of a plurality of segments of the constellation diagram containing the symbol, the segment being delimited by a third axis and a fourth axis each crossing the origin of the constellation diagram and spanning an opening angle of the segment of less than about 90°, wherein the processing unit is further configured to calculate a first coordinate of the symbol with respect to the third axis, and a second coordinate of the symbol with respect to the fourth axis; and a plurality of digital-to-analog converter cells configured to generate the radio frequency signal using the first coordinate and the second coordinate.

In example 2, 360° is a multiple integer of the opening angle for the apparatus of example 1.

In example 3, the opening angle is equal to about 45°, 30°, 22.5°, 18°, 15°, 11.25°, 10°, 9°, 6°, 5°, 4.5°, 3°, 2°, 1° or 0.5° for the apparatus of example 2.

In example 4, the plurality of digital-to-analog converter cells of the apparatus of any of the preceding examples is further configured to generate the radio frequency signal based on a first local oscillator signal and a second local oscillator signal comprising a phase difference equal to the opening angle of the segment.

In example 5, the apparatus of example 4 further comprises a multi-phase generator, wherein the multi-phase generator is configured to: generate the first local oscillator signal using a first signal component of a reference local oscillator signal and information on the segment; and generate the second local oscillator signal using a second signal component of the reference local oscillator signal and the information on the segment.

In example 6, the plurality of digital-to-analog converter cells of the apparatus of example 4 or example 5 is further configured to generate a first radio frequency component using the first coordinate and the first local oscillator signal, and to generate a second radio frequency component using the second coordinate and the second local oscillator signal, and the apparatus further comprises a signal combiner configured to combine the first radio frequency component and the second radio frequency component.

Example 7 is a transmitter comprising an apparatus for generating a radio frequency signal of any of examples 1 to 6.

In example 8, the symbol is related to a baseband signal in the transmitter of example 7.

Example 9 is a mobile communications device comprising a transmitter according to example 7 or example 8.

In example 10, the mobile communications device of example 9 further comprises at least one antenna coupled to the transmitter.

Example 11 is a means for generating a radio frequency signal based on a symbol within a constellation diagram spanned by a first axis representing an in-phase component and an orthogonal second axis representing a quadrature component, the means comprising: a means for selecting a segment of a plurality of segments of the constellation diagram containing the symbol, the one segment being delimited by a third axis and a fourth axis each crossing the origin of the constellation diagram and spanning an opening angle of the segment of less than about 90°, wherein the means for selecting is further configured to calculate a first coordinate of the symbol with respect to the third axis, and a second coordinate of the symbol with respect to the fourth axis; and a means for generating the radio frequency signal using the first coordinate and the second coordinate.

In example 12, the means for generating the radio frequency signal of the means of example 11 is further configured to generate the radio frequency signal based on a first local oscillator signal and a second local oscillator signal comprising a phase difference equal to the opening angle of the segment.

Example 13 is a method for generating a radio frequency signal based on a symbol within a constellation diagram spanned by a first axis representing an in-phase component and an orthogonal second axis representing a quadrature component, the method comprising: selecting a segment of a plurality of segments of the constellation diagram containing the symbol, the segment being delimited by a third axis and a fourth axis each crossing the origin of the constellation diagram and spanning an opening angle of the segment of less than about 90°; calculating a first coordinate of the symbol with respect to the third axis, and a second coordinate of the symbol with respect to the fourth axis; and generating the radio frequency signal using the first coordinate and the second coordinate.

In example 14, 360° is a multiple integer of the opening angle in the method of example 13.

In example 15, the opening angle is equal to about 45°, 30°, 22.5°, 18°, 15°, 11.25°, 10°, 9°, 6°, 5°, 4.5°, 3°, 2°, 1° or 0.5° in the method of example 14.

In example 16, generating the radio frequency signal in the method of any of the preceding examples is further based on a first local oscillator signal and a second local oscillator signal comprising a phase difference equal to the opening angle of the segment.

In example 17, the method of claim 16 further comprises: generating the first local oscillator signal using a first signal component of a reference local oscillator signal and information on the segment; and generating the second local oscillator signal using a second signal component of the reference local oscillator signal and the information on the segment.

In example 18, generating the radio frequency signal in the method of example 16 or example 17 comprises: generating a first radio frequency component using the first coordinate and the first local oscillator signal; generating a second radio frequency component using the second coordinate and the second local oscillator signal; and combining the first radio frequency component and the second radio frequency component.

Example 19 is a computer readable storage medium having stored thereon a program having a program code for performing the method of any of examples 13 to 18, when the program is executed on a computer or processor.

Example 20 is a computer program having a program code configured to perform the method of any of examples 13 to 18, when the computer program is executed on a computer or processor.

Further RF signal generation related aspects that may be applied to examples herein are described in co-pending International Patent Application No. PCT/IB2015/057377, filed under the Patent Cooperation Treaty (PCT) on Sep. 25, 2015, entitled "AN APPARATUS AND A METHOD FOR GENERATING A RADIO FREQUENCY SIGNAL"; copending International Patent Application No. PCT/IB2015/057379, filed under the PCT on Sep. 25, 2015, entitled "AN APPARATUS AND A METHOD FOR APPROXIMATING A FIRST SIGNAL USING A SECOND SIGNAL"; and co-pending International Patent Application No. PCT/IB2015/057376, filed under the PCT on Sep. 25, 2015, entitled "APPARATUSES AND METHODS FOR GENERATING A RADIO FREQUENCY SIGNAL, A MODULATOR, A CONTROLLER FOR A MODULATOR, AND A METHOD FOR CONTROLLING A MODULATOR".

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for generating a radio frequency signal based on a symbol within a constellation diagram spanned by a first axis representing an in-phase component and an orthogonal second axis representing a quadrature component, the apparatus comprising:
   a processing unit configured to select a segment of a plurality of segments of the constellation diagram containing the symbol, the segment being delimited by a third axis and a fourth axis each crossing the origin of the constellation diagram and spanning an opening angle of the segment of less than about 90°,
   wherein the processing unit is further configured to calculate a first coordinate of the symbol on the third axis, and a second coordinate of the symbol on the fourth axis; and
   a plurality of digital-to-analog converter cells configured to generate the radio frequency signal using the first coordinate and the second coordinate.

2. The apparatus of claim 1, wherein 360° is an integer multiple of the opening angle.

3. The apparatus of claim 2, wherein the opening angle is equal to about 45°, 30°, 22.5°, 18°, 15°, 11.25°, 10°, 9°, 6°, 5°, 4.5°, 3°, 2°, 1° or 0.5°.

4. The apparatus of claim 1, wherein the plurality of digital-to-analog converter cells is further configured to generate the radio frequency signal based on a first local oscillator signal and a second local oscillator signal comprising a phase difference equal to the opening angle of the segment.

5. The apparatus of claim 4, further comprising a multi-phase generator, wherein the multi-phase generator is configured to:
   generate the first local oscillator signal using a first signal component of a reference local oscillator signal and information on the segment; and
   generate the second local oscillator signal using a second signal component of the reference local oscillator signal and the information on the segment.

6. The apparatus of claim 4, wherein the plurality of digital-to-analog converter cells is further configured to generate a first radio frequency component using the first coordinate and the first local oscillator signal, and to generate a second radio frequency component using the second coordinate and the second local oscillator signal, and wherein the apparatus further comprises a signal combiner configured to combine the first radio frequency component and the second radio frequency component.

7. A transmitter comprising an apparatus for generating a radio frequency signal according to claim 1.

8. The transmitter of claim 7, wherein the symbol is related to a baseband signal.

9. A method for generating a radio frequency signal based on a symbol within a constellation diagram spanned by a first axis representing an in-phase component and an orthogonal second axis representing a quadrature component, the method comprising:
   selecting a segment of a plurality of segments of the constellation diagram containing the symbol, the segment being delimited by a third axis and a fourth axis each crossing the origin of the constellation diagram and spanning an opening angle of the segment of less than about 90°;
   calculating a first coordinate of the symbol on the third axis, and a second coordinate of the symbol on the fourth axis; and
   generating the radio frequency signal using the first coordinate and the second coordinate.

10. The method of claim 9, wherein 360° is an integer multiple of the opening angle.

11. The method of claim 10, wherein the opening angle is equal to about 45°, 30°, 22.5°, 18°, 15°, 11.25°, 10°, 9°, 6°, 5°, 4.5°, 3°, 2°, 1° or 0.5°.

12. The method of claim 9, wherein generating the radio frequency signal is further based on a first local oscillator signal and a second local oscillator signal comprising a phase difference equal to the opening angle of the segment.

13. The method of claim 12, further comprising:
   generating the first local oscillator signal using a first signal component of a reference local oscillator signal and information on the segment; and
   generating the second local oscillator signal using a second signal component of the reference local oscillator signal and the information on the segment.

14. The method of claim 12, wherein generating the radio frequency signal comprises:
   generating a first radio frequency component using the first coordinate and the first local oscillator signal;
   generating a second radio frequency component using the second coordinate and the second local oscillator signal; and
   combining the first radio frequency component and the second radio frequency component.

15. A non-transitory computer readable storage medium having stored thereon a program having a program code for performing the method according to claim 9, when the program is executed on a computer or processor.

* * * * *